US012722359B2

(12) United States Patent
Mao et al.

(10) Patent No.: US 12,722,359 B2
(45) Date of Patent: Sep. 1, 2026

(54) ACTIVE METAL BRAZING SUBSTRATE AND METHOD FOR MANUFACTURING THE SAME

(71) Applicant: TONG HSING ELECTRONIC INDUSTRIES, LTD., Taipei City (TW)

(72) Inventors: Chih-Wei Mao, Taipei City (TW); Tsung-Ying Chang, Taipei City (TW); Chung-Ho Wei, Taipei City (TW); Ming-Yi Hsu, Taipei City (TW); Chi-Wen Huang, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 138 days.

(21) Appl. No.: 18/432,234

(22) Filed: Feb. 5, 2024

(65) Prior Publication Data

US 2025/0162280 A1 May 22, 2025

(30) Foreign Application Priority Data

Nov. 21, 2023 (TW) ................................ 112144885

(51) Int. Cl.
*B32B 9/04* (2006.01)
*B23K 35/02* (2006.01)
(Continued)

(52) U.S. Cl.
CPC ............ *B32B 9/041* (2013.01); *B23K 35/025* (2013.01); *B23K 35/3006* (2013.01); *B23K 35/302* (2013.01); *B32B 37/06* (2013.01); *B32B 37/24* (2013.01); *C22C 9/00* (2013.01); *B32B 2037/243* (2013.01); *B32B 2255/205* (2013.01); *B32B 2307/202* (2013.01); *B32B 2307/54* (2013.01); *B32B 2307/7376* (2023.05); *B32B 2309/02* (2013.01); *H10W 40/255* (2026.01)

(58) Field of Classification Search
None
See application file for complete search history.

(56) References Cited

U.S. PATENT DOCUMENTS

2022/0037225 A1* 2/2022 Naba ......................... C22C 5/08
2025/0087576 A1* 3/2025 Fujisawa ........... H01L 23/49861

FOREIGN PATENT DOCUMENTS

CN 112319078 A * 2/2021 .............. B41M 1/22
EP 3031789 A1 * 6/2016 ........... B23K 1/0016
(Continued)

*Primary Examiner* — Xiaobei Wang
(74) *Attorney, Agent, or Firm* — Li & Cai Intellectual Property (USA) Office

(57) ABSTRACT

An active metal brazing substrate and a method for manufacturing the same are provided. The active metal brazing substrate includes a ceramic substrate layer, an active metal layer, and a conductive metal layer. The active metal layer is disposed between the ceramic substrate layer and the conductive metal layer. The active metal layer is formed from an active metal solder and an organic dispersion medium. The active metal solder includes silver, copper, and an active metal. Based on a total weight of the active metal solder being 100 wt %, an amount of the silver ranges from 10 wt % to 60 wt %. A peel strength between the ceramic substrate layer and the conductive metal layer ranges from 165 N/cm to 270 N/cm.

10 Claims, 1 Drawing Sheet

(51) Int. Cl.

| | |
|---|---|
| ***B23K 35/30*** | (2006.01) |
| ***B32B 37/06*** | (2006.01) |
| ***B32B 37/24*** | (2006.01) |
| ***C22C 9/00*** | (2006.01) |
| ***H10W 40/25*** | (2026.01) |

(56) References Cited

FOREIGN PATENT DOCUMENTS

| | | | | |
|---|---|---|---|---|
| JP | 2005252087 A | 9/2005 | | |
| JP | 2009170930 A | 7/2009 | | |
| WO | WO-2011023394 A1 * | 3/2011 | ........... | B23K 35/262 |
| WO | WO-2015019602 A1 * | 2/2015 | ........... | B23K 1/0016 |

* cited by examiner

ACTIVE METAL BRAZING SUBSTRATE AND METHOD FOR MANUFACTURING THE SAME

CROSS-REFERENCE TO RELATED PATENT APPLICATION

This application claims the benefit of priority to Taiwan Patent Application No. 112144885, filed on Nov. 21, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an active metal brazing substrate and a method for manufacturing the same, and more particularly to an active metal brazing substrate that has a good connection force and a method for manufacturing the same.

BACKGROUND OF THE DISCLOSURE

With the promotion of energy-saving and carbon reduction policies established in various countries, the global market for electric vehicles is currently booming. In recent years, a plurality of high-voltage (800 volts) vehicle products have been successively launched, which promotes an increasing demand for silicon carbide (SiC) ceramic substrate materials.

However, since requirements on a voltage, a frequency, and an operating temperature of power components of the silicon carbide (SiC) ceramic substrate materials continue to increase, the ceramic substrate materials also need to have better heat dissipation capabilities and reliability.

A direct-bonding-copper (DBC) ceramic substrate that has been widely used is conventionally prepared by eutectic bonding. Hence, there is no bonding material between a copper layer and the ceramic substrate. However, during a high-temperature operation, a large thermal stress is generated due to the difference in thermal expansion coefficients of the copper layer and the ceramic substrate (such as $Al_2O_3$ or AlN), thereby causing the copper layer to peel off from a surface of the ceramic substrate. Therefore, the conventional direct-bonding-copper ceramic substrate can no longer meet packaging requirements of high temperature, high power, high heat dissipation capability, and high reliability.

Currently, use of active metal brazing (AMB) substrate materials are gradually being substituted with direct-bonding-copper ceramic substrate materials as the mainstream substrate material.

The active metal brazing substrate materials usually contain silver. An amount of the silver in the active metal brazing substrate materials often exceeds 50 wt %, and can even be as high as 70 wt %. However, due to the high amount of the silver, active metal brazing ceramic substrates have high material costs, and the problem of electromigration caused by silver atoms in a solder layer may occur.

Therefore, how to decrease the amount of the silver in the solder layer by adjusting the materials and the structure of the active metal brazing ceramic substrate, so as to overcome the above-mentioned problems, has become one of the important issues to be addressed in the industry.

SUMMARY OF THE DISCLOSURE

In response to the above-referenced technical inadequacies, the present disclosure provides an active metal brazing substrate and a method for manufacturing the same.

In order to solve the above-mentioned problems, one of the technical aspects adopted by the present disclosure is to provide an active metal brazing substrate. The active metal brazing substrate includes a ceramic substrate layer, an active metal layer, and a conductive metal layer. The active metal layer is disposed between the ceramic substrate layer and the conductive metal layer. The active metal layer is formed from an active metal solder and an organic dispersion medium. The active metal solder includes silver, copper, and an active metal. Based on a total weight of the active metal solder being 100 wt %, an amount of the silver ranges from 10 wt % to 60 wt %. A peel strength between the ceramic substrate layer and the conductive metal layer ranges from 165 N/cm to 270 N/cm.

In order to solve the above-mentioned problems, another one of the technical aspects adopted by the present disclosure is to provide a method for manufacturing an active metal brazing substrate. The method includes: coating an active metal solder paste onto a ceramic substrate so as to form an active metal layer on the ceramic substrate; and disposing a conductive metal layer onto the active metal layer and then implementing a brazing process to obtain an active metal brazing substrate. The active metal solder paste includes an active metal solder and an organic dispersion medium. The active metal solder includes silver, copper, and an active metal. Based on a total weight of the active metal solder being 100 wt %, an amount of the silver ranges from 10 wt % to 60 wt %. A peel strength between the ceramic substrate layer and the conductive metal layer ranges from 165 N/cm to 270 N/cm.

Therefore, in the active metal brazing substrate and the method for manufacturing the same provided by the present disclosure, by virtue of "the active metal solder including silver, copper, and an active metal" and "based on a total weight of the active metal solder being 100 wt %, an amount of the silver ranging from 10 wt % to 60 wt %," a connection force between the ceramic substrate layer and the conductive metal layer can be enhanced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
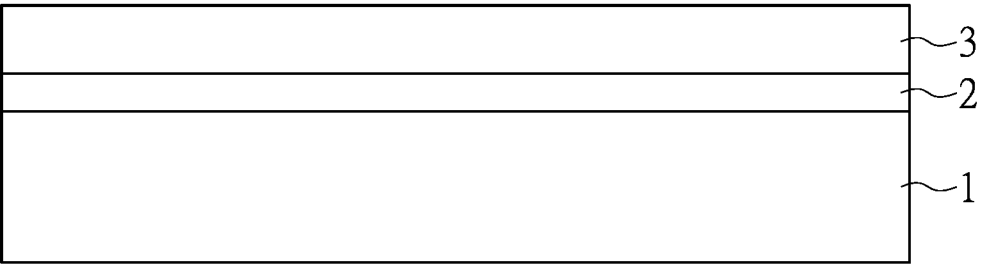
FIG. 1 is a schematic side view of an active metal brazing substrate according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

In order to overcome the problem of a copper layer peeling off from a ceramic substrate due to the differences of thermal expansion coefficients in a conventional direct-bonding-copper ceramic substrate, the present disclosure provides an active metal brazing substrate. In the active metal brazing substrate, the usage of an active metal solder paste enables the copper layer and the ceramic substrate to have a good connection force. Therefore, the active metal brazing substrate can be used in certain package structures that are operated at a high temperature and a high power and require high reliability. In the present disclosure, the connection force between the copper layer and the ceramic substrate is quantified as a peel strength between the ceramic substrate layer and the conductive metal layer for ease of illustration.

Referring to FIG. 1, the active metal brazing substrate of the present disclosure includes a ceramic substrate layer 1, an active metal layer 2, and a conductive metal layer 3. The active metal layer 2 is disposed between the ceramic substrate layer 1 and the conductive metal layer 3, so as to combine the ceramic substrate layer 1 and the conductive metal layer 3.

In FIG. 1, the active metal layer 2 and the conductive metal layer 3 are only disposed on one side of the ceramic substrate layer 1, but the present disclosure is not limited thereto. The active metal layer 2 and the conductive metal layer 3 can be disposed on both sides of the ceramic substrate layer 1 (as shown in FIG. 2).

Figure 2:
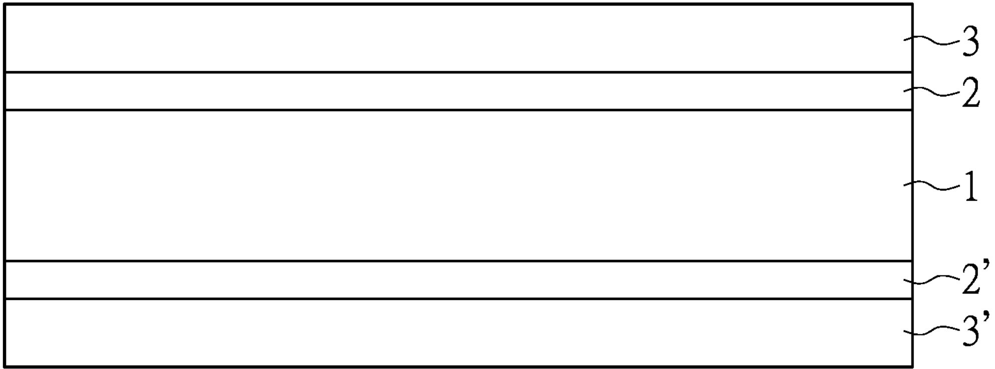
FIG. 2 is a schematic side view of another active metal brazing substrate according to the present disclosure.

Referring to FIG. 2, the active metal brazing substrate can have a symmetrical structure. The active metal layers 2, 2' and the conductive metal layers 3, 3' are disposed on two opposite sides of the ceramic substrate layer 1, respectively. Accordingly, the active metal brazing substrate can be used for manufacturing a package structure that has double conductive layers.

Ceramic Substrate Layer

The ceramic substrate layer 1 can be a silicon nitride (SiN) ceramic substrate, a silicon carbide (SiC) ceramic substrate, an aluminum nitride (AlN) ceramic substrate, or an alumina ($Al_2O_3$) ceramic substrate. The ceramic substrate layer 1 is preferably a ceramic substrate containing silicon, and is more preferably a silicon nitride (SiN) ceramic substrate. A thickness of the ceramic substrate layer 1 can range from 100 μm to 1,000 μm, but the present disclosure is not limited thereto.

Active Metal Layer

The active metal layer 2 is formed from an active metal solder and an organic dispersion medium.

The active metal solder includes silver (Ag), copper (Cu), and an active metal.

Based on a total weight of the active metal solder being 100 wt %, an amount of the silver ranges from 10 wt % to 60 wt %. Since the amount of the silver in the active metal solder is lower than that of the conventional technology, the material costs of the active metal brazing substrate can be decreased, and the probability of electromigration of the silver can also be decreased.

Specifically, based on the total weight of the active metal solder being 100 wt %, the amount of the silver can be 15 wt %, 20 wt %, 25 wt %, 30 wt %, 35 wt %, 40 wt %, 45 wt %, 50 wt %, or 55 wt %.

In an exemplary embodiment, the amount of the silver ranges from 30 wt % to 50 wt %. In another exemplary embodiment, the amount of the silver ranges from 10 wt % to 20 wt %. When the amount of the silver is changed, an amount of the copper, an amount of the active metal, and a brazing temperature for forming the active metal layer 2 need to be adjusted accordingly, so as to maintain a high connection force between the ceramic substrate layer 1 and the conductive metal layer 3.

During a vacuum sintering process, the silver of the active metal layer 2 can be partially diffused into an interface between the active metal layer 2 and the conductive metal layer 3, and form a silver-copper alloy with copper atoms of the conductive metal layer 3.

In an exemplary embodiment, based on the total weight of the active metal solder being 100 wt %, the amount of the copper ranges from 30 wt % to 80 wt %, and the amount of the active metal ranges from 1 wt % to 10 wt %.

Specifically, the amount of the copper can be 35 wt %, 40 wt %, 45 wt %, 50 wt %, 55 wt %, 60 wt %, 65 wt %, 70 wt %, or 75 wt %.

Specifically, the amount of the active metal can be 2 wt %, 4 wt %, 6 wt %, or 8 wt %. Preferably, based on the total weight of the active metal solder paste being 100 wt %, the amount of the active metal ranges from 2 wt % to 4 wt %.

It should be noted that a melting point of the active metal is low, such that the active metal is melted in advance in the vacuum sintering process. The melted active metal can be filled in small openings of the ceramic substrate layer 1 or the conductive metal layer 3, and can even react with the ceramic substrate layer 1. On the other hand, the active metal can also decrease an electrical impedance of the active metal layer 2.

Specifically, the active metal can be selected from the group consisting of: titanium (Ti), zirconium (Zr), tantalum (Ta), niobium (Nb), vanadium (V), and hafnium (Hf).

During the vacuum sintering process, the active metal of the active metal layer 2 can be partially diffused into an interface between the active metal layer 2 and the ceramic substrate layer 1, so as to form a metal silicide with silicon atoms of the ceramic substrate layer 1 or form a metal nitride with nitrogen atoms of the ceramic substrate layer 1. Similarly, the active metal of the active metal layer 2 can also be partially diffused into the interface between the active metal layer 2 and the conductive metal layer 3 to form an alloy. Therefore, the ceramic substrate layer 1 and the conductive metal layer 3 can have a good connection force.

In an exemplary embodiment, the active metal is titanium metal. In the vacuum sintering process, titanium atoms are partially diffused into the ceramic substrate layer 1, and form titanium silicide (TiSi), silicon nitride (TiN), or titanium disilicide ($TiSi_2$) with the silicon atoms or the nitrogen atoms. Moreover, the titanium atoms can also be diffused into the conductive metal layer 3 and form a titanium-copper alloy with the copper atoms of the conductive metal layer 3, but the present disclosure is not limited thereto.

When the active metal layer 2 is too thin, the connection force between the ceramic substrate layer 1 and the conductive metal layer 3 will decrease. When the active metal layer 2 is too thick, the material costs of the active metal layer 2 can be too high, which is not beneficial for mass production. Therefore, a thickness of the active metal layer 2 can be higher than or equal to 6 μm. Preferably, the thickness of the active metal layer 2 can range from 10 μm to 30 μm, such as 12 μm, 14 μm, 16 μm, 18 μm, 20 μm, 22 μm, 24 μm, 26 μm, or 28 μm. More preferably, the thickness of the active metal layer 2 can range from 18 μm to 24 μm.

Conductive Metal Layer

The conductive metal layer 3 can be disposed on the ceramic substrate layer 1 via the active metal layer 2. Specifically, the conductive metal layer 3 can be a copper foil, an aluminum foil, or a copper-aluminum alloy foil. In an exemplary embodiment, the conductive metal layer 3 is a copper foil.

A thickness of the conductive metal layer 3 can range from 50 μm to 1,200 μm. Preferably, the thickness of the conductive metal layer 3 can range from 200 μm to 800 μm, but the present disclosure is not limited thereto.

Method for Manufacturing Active Metal Brazing Substrate

In step S1, the active metal solder paste is prepared. The active metal solder paste is used to form the active metal layer 2.

The active metal solder paste includes the active metal solder and the organic dispersion medium mentioned above.

The active metal solder includes the above-mentioned silver, copper, and active metal. In an exemplary embodiment, the active metal solder is a combination of a silver powder, a copper powder, and an active metal powder. In another embodiment, the active metal solder can also be a combination of an active metal powder and at least one of a silver powder, a copper powder, and a silver-copper alloy powder.

As mentioned above, based on the total weight of the active metal solder being 100 wt %, the amount of the silver ranges from 10 wt % to 60 wt %.

The organic dispersion medium can help disperse the active metal solder, and can help solidify the active metal solder paste to form the active metal layer 2. Specifically, the organic dispersion medium includes a paste agent, an organic solvent, and a thixotropic agent. Based on a total weight of the organic dispersion medium being 100 wt %, an amount of the paste agent ranges from 20 wt % to 30 wt %, an amount of the organic solvent ranges from 50 wt % to 70 wt %, and an amount of the thixotropic agent ranges from 1 wt % to 5 wt %.

For example, the paste agent can be selected from the group consisting of silicone oil, white oil, polyvinyl alcohol, acrylic resin, nitrocellulose, ethylcellulose, dimethyl phthalate, and carboxymethylcellulose. Preferably, the paste agent is ethylcellulose.

The organic solvent can be selected from the group consisting of ethylene glycol butyl ether acetate, diethylene glycol, triethanolamine, butyl cellosolve (ethylene glycol monobutyl ether), tert-butyl alcohol, N,N-dimethylformamide, terpineol, and nonylphenol polyglycol ether. Preferably, the organic solvent can be terpineol or ethylene glycol butyl ether acetate.

The thixotropic agent can be selected from the group consisting of polyamide wax, hydrogenated castor oil, and polyurea. Preferably, the thixotropic agent is polyamide wax.

The active metal solder and the organic dispersion medium are mixed at a weight ratio of 70% to 95%:5% to 30%, so that the active metal solder paste is formed to have a viscosity ranging from 50 mPa's to 300 mPa·s. Preferably, the weight ratio of the active metal solder to the organic dispersion medium is 75% to 90%:10% to 25%.

However, the present disclosure is not limited to the examples mentioned above, and as long as the active metal solder and the organic solvent can be prepared into the active metal solder paste that has a suitable viscosity for being coated onto the ceramic substrate layer 1 and forming the active metal layer 2, such a process or configuration for achieving the same is considered within the spirit and scope of the present disclosure.

In step S2, the active metal solder paste can be coated onto the ceramic substrate layer 1 by screen printing, and dried at a temperature ranging from 90° C. to 110° C. for 5 minutes to 15 minutes. In this way, most of the organic solvent in the active metal solder paste will volatilize, thereby forming the active metal layer 2.

In step S3, the conductive metal layer 3 is disposed onto the active metal layer 2, and then a brazing process is implemented to fix the conductive metal layer 3 onto the ceramic substrate layer 1.

The brazing process includes a first heat treatment stage and a second heat treatment stage, which can be implemented in a vacuum environment. A processing temperature of the first heat treatment stage is not higher than 500° C. A processing temperature of the second heat treatment stage ranges from 900° C. to 1,100° C. (i.e., a brazing temperature). The processing temperature of the second heat treatment stage is higher than the processing temperature of the first heat treatment stage.

Specifically, in the first heat treatment stage, the processing temperature ranges from 300° C. to 500° C., and a processing period ranges from 30 minutes to 60 minutes. In the second heat treatment stage, the processing temperature ranges from 900° C. to 1,100° C., and a processing period ranges from 60 minutes to 240 minutes. In addition, temperature rising rates of the heat treatment stages mentioned above can range from 5° C./min to 30° C./min, and temperature descending rates of the heat treatment stages mentioned above can range from 2° C./min to 30° C./min.

It should be noted that the brazing temperature of the brazing process can be adjusted according to the amount of the silver in the active metal layer 2, so as to enable the ceramic substrate layer and the conductive metal layer to have a good peel strength. Specifically, when the amount of the silver in the active metal layer 2 ranges from 30 wt % to 50 wt %, the brazing temperature of the brazing process can range from 900° C. to 950° C. When the amount of the silver in the active metal layer 2 ranges from 10 wt % to 20 wt %, the brazing temperature of the brazing process can range from 1,000° C. to 1,100° C.

During the brazing process, the organic dispersion medium is partially vaporized. A surface of the ceramic substrate layer 1 is wet by the active metal, and the ceramic substrate layer 1 reacts with the active metal, so as to enhance a connection force between the active metal layer 2 and the ceramic substrate layer 1. Moreover, the active metal and metal atoms of the conductive metal layer 3 undergo a micron-scaled eutectic reaction at the interface between the active metal layer 2 and the conductive metal layer 3, thereby forming a strong eutectic structure. Hence, the active metal layer 2 and the conductive metal layer 3 are tightly combined.

Tests 1 to 10

In order to compare the influences of the amount of the silver in the active metal layer 2, the brazing temperature, and the thickness of the active metal layer 2 on the peel strength between the ceramic substrate layer and the conductive metal layer, metal-ceramic substrates of Test 1 to Test 10 are prepared by steps S1 to S3 mentioned above.

In the metal-ceramic substrates of Test 1 to Test 10, the ceramic substrate layer 1 is a silicon nitride ceramic substrate, the active metal layer 2 includes silver, copper, and titanium, and the conductive metal layer 3 is a copper layer.

During preparation of the active metal solder paste, ethylcellulose is used as the paste agent, ethylene glycol butyl ether acetate is used as the organic solvent, and polyamide wax is used as the thixotropic agent. Based on the total weight of the organic dispersion medium being 100 wt %, the amount of the paste agent ranges from 20 wt % to 30 wt %, the amount of the organic solvent ranges from 50 wt % to 70 wt %, and the amount of the thixotropic agent ranges from 1 wt % to 5 wt %.

The specific amount of the silver in the active metal solder (the active metal layer 2), the specific brazing temperature, and the specific thickness of the active metal layer 2 are listed in Table 1. The peel strength between the ceramic substrate layer and the conductive metal layer is measured at 25° C. according to the JIS-C-6481 standard, and results thereof are listed in Table 1.

TABLE 1

| | Amount of silver in active metal solder (wt %) | Brazing temperature (° C.) | Thickness of active metal layer (μm) | Peel strength between ceramic substrate layer and conductive metal layer (N/cm) |
|---|---|---|---|---|
| Test 1 | 54 | 950 | 24 | 170 |
| Test 2 | 48.75 | 950 | 24 | 266.64 |
| Test 3 | 36.5 | 950 | 24 | 196.14 |
| Test 4 | 18.45 | 950 | 24 | N/A |
| Test 5 | 48.75 | 950 | 18 | 251.04 |
| Test 6 | 35.6 | 950 | 18 | 201.15 |
| Test 7 | 18.9 | 950 | 18 | 12.31 |
| Test 8 | 18.9 | 1,015 | 18 | 248.84 |
| Test 9 | 15.75 | 1,015 | 18 | 142.92 |
| Test 10 | 73 | 950 | 24 | 178 |

According to the results in Table 1, when the amount of the silver in the active metal layer ranges from 10 wt % to 60 wt %, the peel strength between the ceramic substrate layer and the conductive metal layer can range from 165 N/cm to 270 N/cm. According to Test 1 to Test 4, when the amount of the silver in the active metal layer ranges from 20 wt % to 50 wt %, the peel strength between the ceramic substrate layer and the conductive metal layer can range from 180 N/cm to 270 N/cm.

Even if the thickness of the active metal layer is decreased to 18 μm, the active metal brazing substrate can still have a high peel strength. According to Test 5 to Test 7, when the amount of the silver in the active metal layer ranges from 20 wt % to 50 wt %, the peel strength between the ceramic substrate layer and the conductive metal layer can range from 180 N/cm to 270 N/cm.

Based on the experimental results, the peel strength between the ceramic substrate layer and the conductive metal layer can be enhanced by increasing the brazing temperature. According to Test 8 and Test 9, when the brazing temperature is raised to 1,015° C., even if the amount of the silver in the active metal layer only ranges from 10 wt % to 20 wt %, the peel strength between the ceramic substrate layer and the conductive metal layer can still range from 140 N/cm to 250 N/cm.

According to the results above, by adjusting the amount of the silver in the active metal layer and the brazing temperature, the ceramic substrate layer and the conductive metal layer of the present disclosure can have a good peel strength, and can be applied in certain package structures that are operated under a high temperature and a high power and require high reliability.

Beneficial Effects of the Embodiment

In conclusion, in the active metal brazing substrate and the method for manufacturing the same provided by the present disclosure, by virtue of "the active metal solder including silver, copper, and an active metal" and "based on a total weight of the active metal solder being 100 wt %, an amount of the silver ranging from 10 wt % to 60 wt %," a connection force between the ceramic substrate layer and the conductive metal layer can be enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An active metal brazing substrate, comprising:

a ceramic substrate layer;

an active metal layer formed from an active metal solder and an organic dispersion medium, the active metal solder consisting of silver, copper, and an active metal;

wherein the active metal is selected from the group consisting of: titanium (Ti), zirconium (Zr), tantalum (Ta), niobium (Nb), vanadium (V), and hafnium (Hf);

wherein, based on a total weight of the active metal solder being 100 wt %, an amount of the copper ranges from 65 wt % to 80 wt %, and an amount of the silver ranges from 10 wt % to 34 wt %; and a conductive metal layer, wherein the active metal layer is disposed between the ceramic substrate layer and the conductive metal layer;

wherein a peel strength between the ceramic substrate layer and the conductive metal layer ranges from 165 N/cm to 270 N/cm.

2. The active metal brazing substrate according to claim 1, wherein, based on the total weight of the active metal solder being 100 wt %, the amount of the silver ranges from 30 wt % to 34 wt %.

3. The active metal brazing substrate according to claim 1, wherein, based on the total weight of the active metal solder being 100 wt %, the amount of the silver ranges from 10 wt % to 20 wt %.

4. The active metal brazing substrate according to claim 1, wherein, based on the total weight of the active metal solder being 100 wt %, an amount of the active metal ranges from 2 wt % to 4 wt %.

5. The active metal brazing substrate according to claim 1, wherein a thickness of the active metal layer is higher than or equal to 6 μm.

6. The active metal brazing substrate according to claim 5, wherein the thickness of the active metal layer ranges from 18 μm to 24 μm.

7. A method for manufacturing an active metal brazing substrate, comprising:

coating an active metal solder paste onto a ceramic substrate, so as to form an active metal layer on the ceramic substrate; wherein the active metal solder paste includes an active metal solder and an organic dispersion medium, and a weight ratio between the active metal solder and the organic dispersion medium is 70% to 95%: 5% to 30%; wherein the active metal solder consists of silver, copper, and an active metal, and the active metal is selected from the group consisting of: titanium (Ti), zirconium (Zr), tantalum (Ta), niobium (Nb), vanadium (V), and hafnium (Hf); wherein, based on a total weight of the active metal solder being 100 wt %, an amount of the copper ranges from 65 wt % to 80 wt %, and an amount of the silver ranges from 10 wt % to 34 wt %; and disposing a conductive metal layer onto the active metal layer, and then implementing a brazing process to obtain the active metal brazing substrate; wherein a peel strength between the ceramic substrate layer and the conductive metal layer ranges from 165 N/cm to 270 N/cm.

8. The method according to claim 7, wherein, based on the total weight of the active metal solder being 100 wt %, the amount of the silver ranges from 30 wt % to 34 wt %; wherein a brazing temperature of the brazing process ranges from 900° C. to 950° C.

9. The method according to claim 7, wherein, based on the total weight of the active metal solder being 100 wt %, the amount of the silver ranges from 10 wt % to 20 wt %; wherein a brazing temperature of the brazing process ranges from 1,000° C. to 1,100° C.

10. An active metal brazing substrate, comprising:

a ceramic substrate layer;

an active metal layer formed from an active metal solder and an organic dispersion medium, the active metal solder consisting of silver, copper, and an active metal;

wherein the active metal is selected from the group consisting of: titanium (Ti), zirconium (Zr), tantalum (Ta), niobium (Nb), vanadium (V), and hafnium (Hf);

wherein, based on a total weight of the active metal solder being 100 wt %, an amount of the copper is greater than 60 wt % and less than or equal to 80 wt %; and a conductive metal layer, wherein the active metal layer is disposed between the ceramic substrate layer and the conductive metal layer;

wherein a peel strength between the ceramic substrate layer and the conductive metal layer ranges from 165 N/cm to 270 N/cm.

* * * * *